(12) United States Patent
Sueyoshi

(10) Patent No.: US 6,583,059 B2
(45) Date of Patent: Jun. 24, 2003

(54) SEMICONDUCTOR DEVICE AND METHOD OF MANUFACTURING THE SAME

(75) Inventor: Yasuhiko Sueyoshi, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/960,513

(22) Filed: Sep. 24, 2001

(65) Prior Publication Data

US 2002/0072233 A1 Jun. 13, 2002

(30) Foreign Application Priority Data

Dec. 11, 2000 (JP) ........................................ 2000-375582

(51) Int. Cl.⁷ ........................................... H01L 21/4763
(52) U.S. Cl. ....................... 438/692; 438/586; 438/595; 438/655; 438/682
(58) Field of Search ................................ 438/585, 586, 438/595, 655, 682, 692

(56) References Cited

U.S. PATENT DOCUMENTS

| | | | | |
|---|---|---|---|---|
| 5,895,245 A | * | 4/1999 | Harvey et al. | 438/305 |
| 6,171,919 B1 | * | 1/2001 | Besser et al. | 438/305 |
| 6,204,136 B1 | * | 3/2001 | Chan et al. | 438/305 |
| 6,368,949 B1 | * | 4/2002 | Chen et al. | 438/592 |

FOREIGN PATENT DOCUMENTS

JP        6-132243        5/1994

* cited by examiner

*Primary Examiner*—Trung Dang
(74) *Attorney, Agent, or Firm*—Nixon & Vanderhye P.C.

(57) ABSTRACT

A method of manufacturing a semiconductor device comprises the steps of: (a) forming a thermal oxide film on a surface of a silicon layer; (b) removing the thermal oxide film; and (c) forming a silicide film on the resulting surface of the silicon layer.

9 Claims, 4 Drawing Sheets

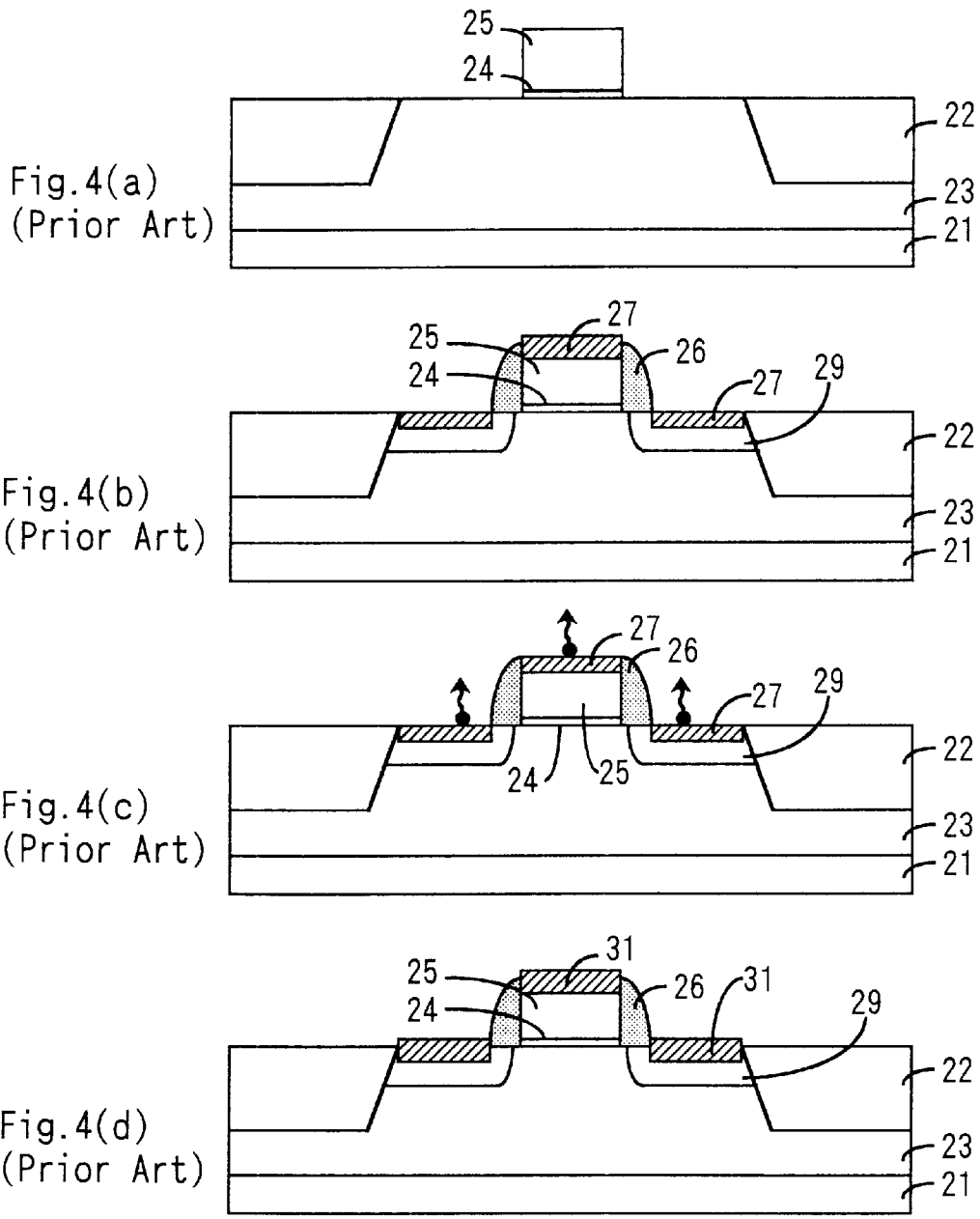

SEMICONDUCTOR DEVICE AND METHOD OF MANUFACTURING THE SAME

CROSS-REFERENCE TO RELATED APPLICATION

This application is related to Japanese application No. 2000-375582 filed on Dec. 11, 2000, whose priority is claimed under 35 USC §119, the disclosure of which is incorporated by reference in its entirety.

BACKGROUND OF THE INVENTION

1. Field of the Invention

The present invention relates to a semiconductor device and a method of manufacturing the same. In particular it relates to a semiconductor device in which a silicide film is formed on the surfaces of a gate electrode and a source/drain region, and a method of manufacturing the same.

2. Description of Related Art

In accordance with the progress in integration of MOS semiconductor devices, the size of a MOSFET (MOS field effect transistor) to be formed on a substrate has been miniaturized. When the MOSFET is miniaturized in a submicron order, parasitic resistances of a gate electrode and a source/drain of the MOSFET hinder high-speed processing of the MOS integrated circuit. To reduce such parasitic resistances, there has been developed a method of vapor-depositing a refractory metal and heating it to form a low resistive metal silicide on the gate electrode and the source/drain region in a self-alignment manner (Salicide technique). According to the technique, sheet resistance of a diffusion layer can be reduced from a conventional value of 50 to 100 $\Omega/\square$ to 2 to 3 $\Omega/\square$, which is one or more-digit smaller than the conventional value. Accordingly, influence exerted on an operation capability of the device can be ignored. As a metal material for forming the silicide, Ti has been proposed because of its property of silicide formation and low resistivity. Titanium silicide has already been practically utilized in processors and the like.

Hereinafter, description is made with reference to FIGS. 4(a) to 4(b) to a part of a process of manufacturing MOSFET by Salicide technique described in Japanese Unexamined Patent Publication No. Hei 6 (1994)-132243.

As shown in FIG. 4(a), a device isolation regions 22 are formed first on a surface of a semiconductor substrate 21. Boron ions are then implanted to a surface region of the semiconductor substrate 21 and activated by thermal treatment to form a P well 23.

Then, a gate insulating film 24 is formed by thermal oxidation and a polysilicon film containing no impurities is deposited on the entire surface by chemical vapor deposition (CVD). Then, the polysilicon film is patterned by photolithography and reactive ion etching (RIE) to form a gate electrode 25.

Thereafter, as shown in FIG. 4(b), a silicon oxide film is formed on the entire surface by CVD and the silicon oxide film is anisotropically etched using ions containing C and F to form sidewall films 26 on the sidewalls of the gate electrode 25. At the end of the etching, the surfaces of the gate electrode 25 and the semiconductor substrate 21 are exposed to plasma so that a layer 27 which is contaminated and/or damaged by fluorocarbon and/or SiC is formed. The contaminated and/or damaged layer 27 causes increase in resistance of a silicide layer 31 (see FIG. 4(d)).

Then, using the gate electrode 25 and the sidewall films 26 as a mask, boron difluoride ions are implanted and activated by thermal treatment in $N_2$ atmosphere at 1000° C. for about 10 seconds to form a source/drain region 29. At this time, the boron difluoride ions are also implanted in the gate electrode 25.

Next, as shown in FIG. 4(c), residual contaminants 30 on the gate electrode 25 which is not covered with the sidewall films 26 and on the source/drain region 29 are released by lamp heating in an inert gas. Then, a spontaneous oxide film is removed from the surfaces of the gate electrode 25 and the source/drain region 29 by Ar ion sputter etching. Accordingly, the silicon surfaces of the gate electrode 25 and the source/drain region 29 are exposed.

Thereafter, as shown in FIG. 4(d), a refractory metal film is vapor-deposited on the entire surface and heated to form a silicide film 31 on the gate electrode 25 and the source/drain region 29, respectively.

However, in the conventional techniques, the residual contaminants 30 on the surface of the silicon substrate are removed, but the layer contaminated by fluorocarbon and the damaged layer containing SiC cannot be removed from the surfaces of the gate electrode and the semiconductor substrate. This increases the sheet resistance of the silicide film, which may cause deterioration of transistor properties.

SUMMARY OF THE INVENTION

Then, to solve the above-mentioned problems, the invention provides a method of for forming a silicide capable of removing the contaminated and damaged layers.

According to the present invention, provided is a method of manufacturing a semiconductor device comprising the steps of: (a) forming a thermal oxide film on a surface of a silicon layer; (b) removing the thermal oxide film; and (c) forming a silicide film on the resulting surface of the silicon layer.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 4(a) to 4(d) are sectional view for illustrating steps of manufacturing a semiconductor device according to the prior art.

DESCRIPTION OF THE PREFERRED EMBODIMENTS

Figure 1A:
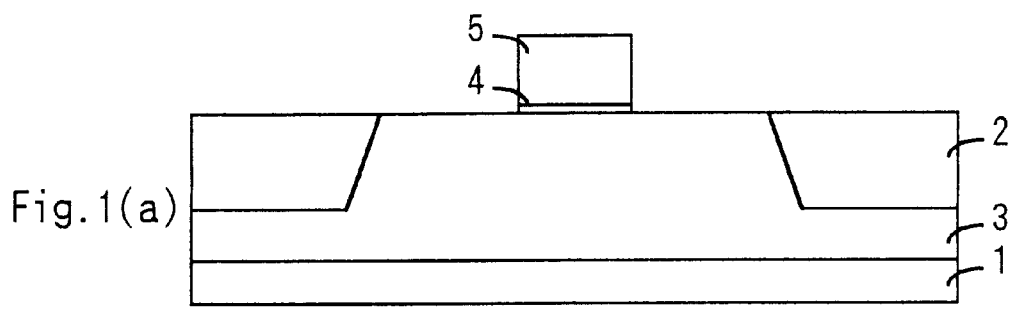
FIGS. 1(a) to 1(e) are sectional views for illustrating steps of manufacturing a semiconductor device according to Embodiment of the present invention.

According to the present invention, first, a thermal oxide film is formed on a surface of a silicon layer in the step (a). The silicon layer may be a layer functioning as a source/ drain region which is formed in a silicon substrate as a semiconductor substrate and a surface silicon layer of a so-called SOI substrate, a layer functioning as a gate electrode, wiring or the like which is formed by a silicon pattern made of single crystalline, polycrystalline or amorphous silicon, and the like. The thermal oxide film may be formed over the entire silicon layer region including the source/drain region, the gate electrode and the like, or on a part of the silicon layer region. In particular, the silicon layer is preferably a layer that has gone through a treatment using ions or plasma containing fluorine and carbon and thus contaminated and/or damaged by fluorocarbon and/or SiC.

The thermal oxide film may be formed by a thermal treatment at about 500 to 1200° C. under an atmosphere of oxygen gas or air. A thickness of the thermal oxide film may appropriately be adjusted depending on a thickness of the contaminated or damaged surface silicon layer, a junction depth of the source/drain region and the like. Where the silicon layer serves as the source/drain region, it is preferred that the thickness of the thermal oxide film satisfies $Y1<Y2/X$ (wherein Y1 is a thickness of the thermal oxide film, Y2 is a junction depth of the source/drain region and X is a ratio of a consumed thickness of silicon layer with respect to the thickness of the thermal oxide film). In this case, in the thus obtained thermal oxide film, $100 \cdot (1-X)$ % of the total thickness thereof grows upward from the original silicon layer (before the formation of the thermal oxide film) and $100 \cdot X$ % of the thickness grows downward from the original silicon layer. Specifically, the thickness of the thermal oxide film may be about 5 nm or more.

For example, calculation of a maximum thickness of the thermal oxide film is performed regarding a sheet resistance of 3 $\Omega/\square$ (flat conversion) as a target value. In this case, an initial thickness of the silicon layer in the salicide technique is 70 nm. Provided that a PN junction depth is 95 to 100 nm, the thickness of the silicon oxide film needs to be 55 nm or less (on the assumption that a Si consumption amount X is 0.455 with respect to the silicon oxide film as 1). With the thickness of the silicon oxide film of 55 nm or less, above region of the PN junction becomes the silicide film, the PN junction does not disappear.

Then, in the step (b), the thermal oxide film is removed. The removal of the thermal oxide film may be carried out by a known method such as wet etching using an acidic or alkaline solution, dry etching, sputtering or the like. Among them, wet etching using hydrofluoric acid solution is preferable.

In the step (c), a silicide film is formed on the resulting silicon layer. The silicide film may be formed by a known method of forming a metal film of Ti, Ta, Co, W, Ni, Cr, V, Mo, Nb, Pd or Hf, subjecting the metal film to a thermal treatment, and removing an unreacted part of the metal film. A thickness of the metal film may be, for example, about 5 to 70 nm. The thermal treatment may be carried out at about 300 to 800° C. The unreacted part of the metal film may be removed by wet etching. Alternatively, a layer of $TiS_2$, $TaSi_2$, $WSi_2$, $CoSi_2$, $NiSi_2$ or a layer of a mixture of them may be formed directly on the silicon layer by CVD or sputtering. Where the silicide layer is finally formed in the source/drain region, the thickness thereof is preferably smaller than a junction depth of the source/drain region.

Hereinafter, the semiconductor device of the present invention and the method of manufacturing the same will be explained with reference to the figures.

First, as shown in FIG. 1(a), a device isolation regions 2 are formed on the surface of a semiconductor substrate 1. Boron ions are implanted in a surface region of the semiconductor substrate 1 and activated by a thermal treatment to form a P well 3. Then, a gate insulating film 4 is formed by thermal oxidation and a polysilicon film is deposited on the entire surface by CVD. Then, the polysilicon film is patterned by known lithography and RIE to form a gate electrode 5.

Figure 1B:
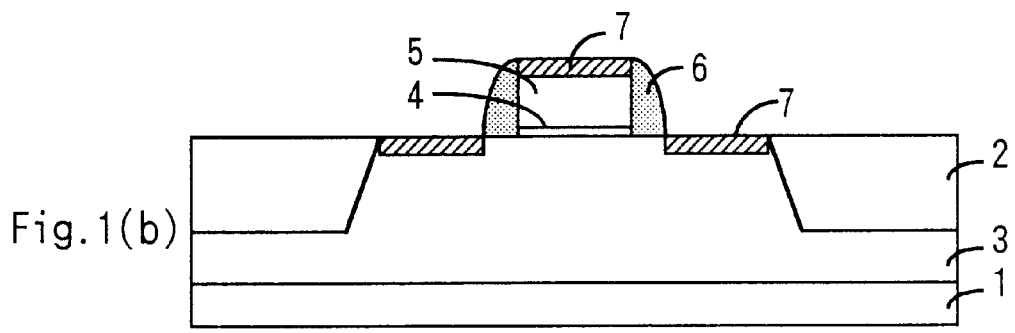

Next, as shown in FIG. 1(b), a silicon oxide film is formed on the entire surface by CVD. Then, the silicon oxide film is anisotropically etched using a reactive ion etching apparatus and ions containing C and F. Accordingly, sidewall films 6 are formed on the sidewalls of the gate electrode 5. At this time, layers 7 contaminated and/or damaged layer by fluorocarbon and/or SiC are formed on the surfaces of the gate electrode 5 and the semiconductor substrate 1.

Figure 1C:
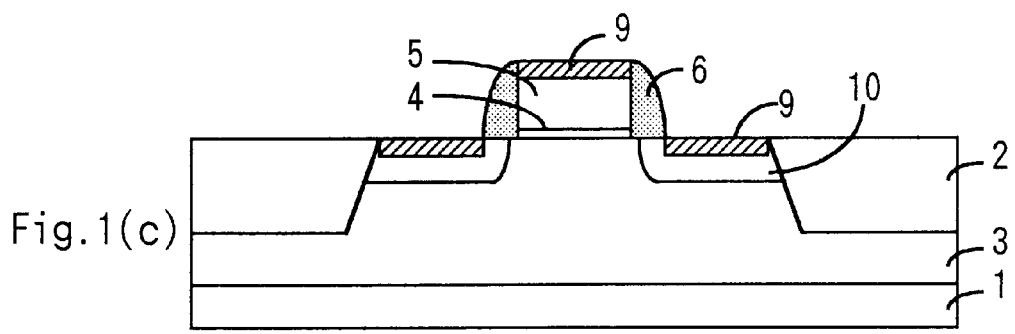

Then, as shown in FIG. 1(c), boron difluoride ions are implanted in the surface region of the semiconductor substrate 1 and the gate electrode 5. Through the ion implantation, the contaminated and/or damaged layers 7 are expanded. To the silicon surfaces of the gate electrode 5 and the semiconductor substrate 1, thermal treatment is carried out using a lamp in a single wafer chamber system under $O_2$ gas atmosphere at 1100° C. for about 22 seconds, thereby a silicon oxide film 9 of about 5 nm thick is deposited. At this time, the layers 7 that have been existed on the surfaces of the gate electrode 5 and the semiconductor substrate 1 are assimilated into the silicon oxide film 9. Further, heat generated during the formation of the silicon oxide film 9 activates the implanted ions, which forms a source/drain region 10.

Figure 1D:
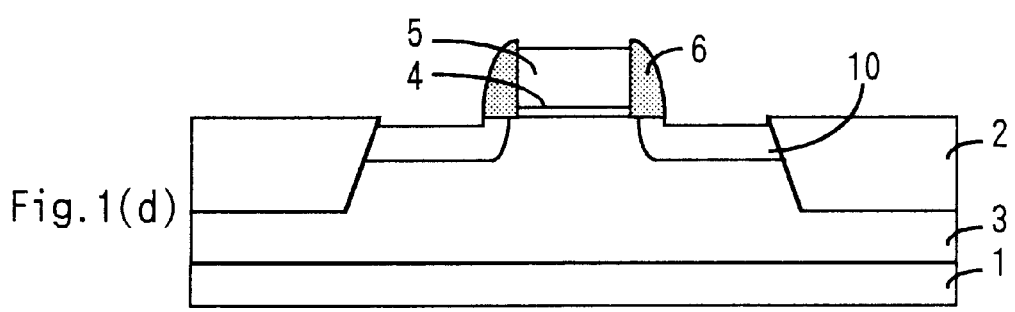

Then, as shown in FIG. 1(d), wet etching using a hydrofluoric acid solution or the like is carried out to remove the silicon oxide film 9 existing on the top surface of the gate electrode which is not covered with the sidewall films 26, as well as the layers 7 on the source/drain region 10. At the same time, the silicon surfaces of the gate electrode 5 and the source/drain region 10 are exposed.

Figure 1E:
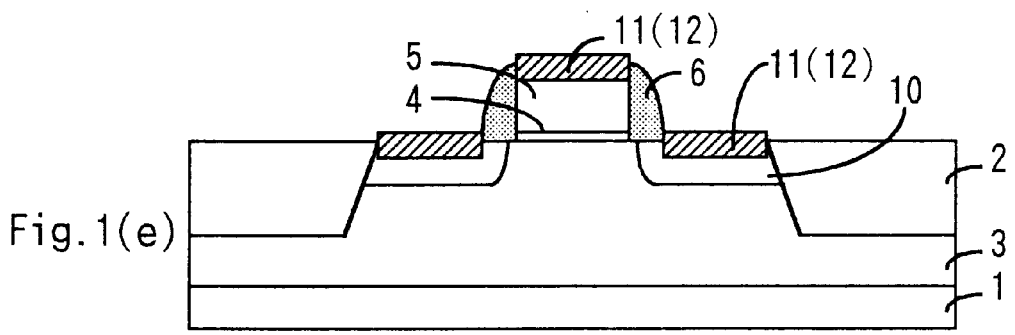

As shown in FIG. 1(e), a Ti film of about 35 to 55 nm thick is deposited by sputtering to serve as a refractory metal film. The deposition of Ti is carried out under DC of 2000W and Ar of 100 sccm.

Thereafter, RTA (rapid thermal anneal) is carried out under $N_2$ atmosphere at 650 to 700° C. for 30 seconds to cause a solid phase reaction between Ti as the refractory metal and silicon so that a high resistive silicide is formed (specific resistance of 70 to 100 $\mu\Omega$·cm). At this time, the Ti film causes silicide reaction only with the exposed silicon surface but does not react with unexposed silicon.

Then, unreacted Ti is selectively removed by using a mixture solution of sulfuric acid and hydrogen peroxide so that a silicide film 11 formed by salicide technique is left on the surfaces of the gate electrode 5 and the source/drain region 10. Further, RTA treatment is carried out under $N_2$ atmosphere at 850 to 900° C. for 10 seconds to convert the silicide film into a low resistive silicide film 12 (specific resistance=13 to 20 $\mu\Omega$·cm).

Figure 2:
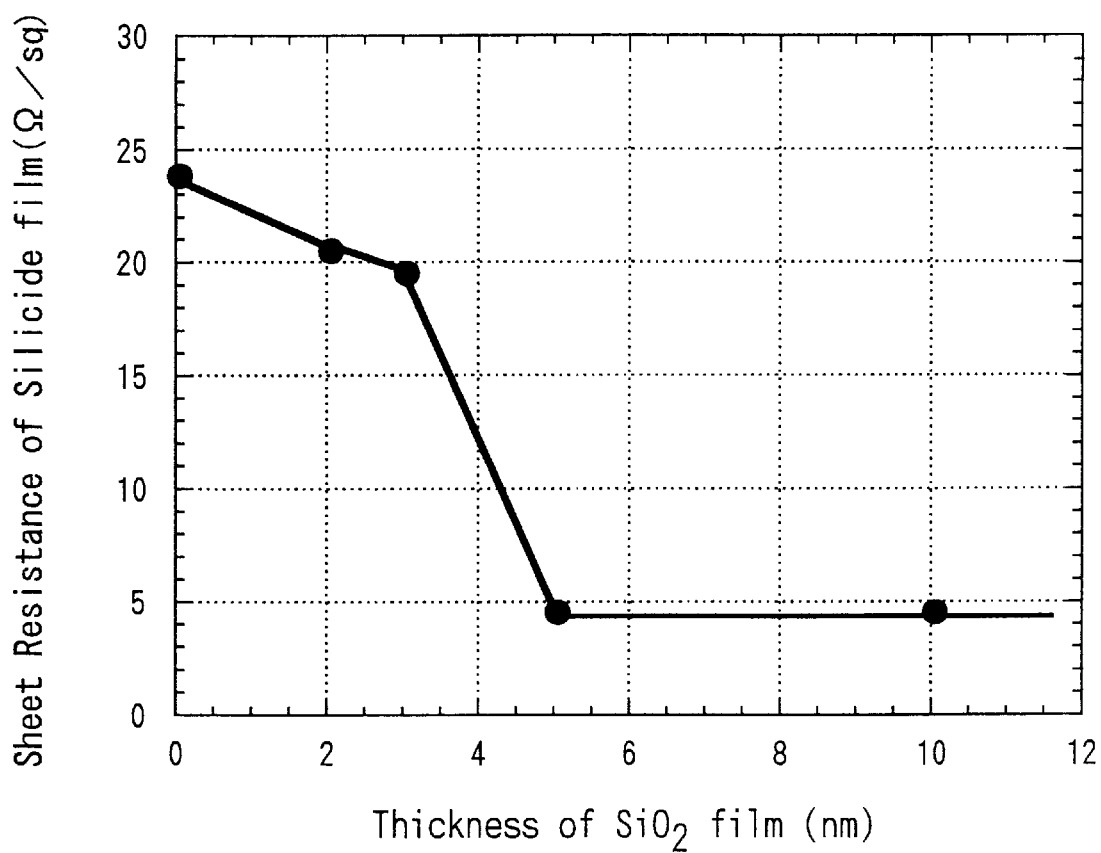
FIG. 2 is a graph for illustrating an effect of the semiconductor device of the present invention on reduction of sheet resistance.
Figure 3:
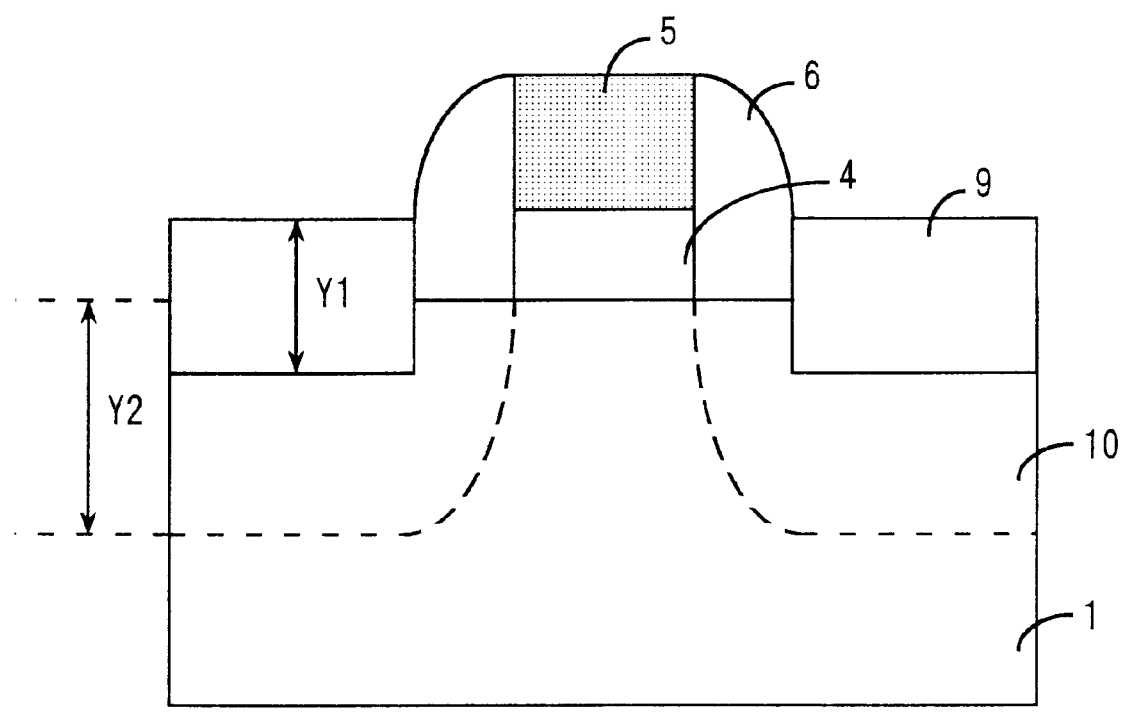
FIG. 3 is a schematic sectional view for illustrating the semiconductor device of the present invention in the course of manufacturing steps in which a silicon oxide film has been formed.

FIG. 2 shows the effect on reduction of the sheet resistance of the Ti silicide film formed by the method according to Embodiment of the present invention. FIG. 2 shows that the sheet resistance of the Ti silicide film is reduced by about 85% through the removal of the silicon oxide film of about 5 nm thick using a hydrofluoric acid solution. That is, the removal with the hydrofluoric acid solution allows reduction in sheet resistance of the Ti silicide film.

The thickness of the silicon oxide film in which the contaminated and/or damaged layer is assimilated is adjusted so as not to exceed the junction depth of the source/drain region 10. That is, the silicon oxide film is formed in a suitable thickness such that a silicon interface below the silicide film to be formed in a later step does not contact an the PN junction. Thus, reduction of junction breakdown voltage is prevented.

According to the present invention, the contaminated and/or damaged layers existing on the surfaces of the gate electrode and the source/drain region before the formation of the silicide film are assimilated into the silicon oxide film formed by thermal oxidation, and then the silicon oxide film is removed to get rid of the damaged and/or contaminated layers. Thereby the increase in sheet resistance of the silicide film is avoided.

Further, according to the present invention, ions implanted in the source/drain region are activated simultaneously with the formation of the silicon oxide film, which simplifies the manufacturing process.

Still according to the present invention, the surfaces of the gate electrode and the source/drain region are exposed simultaneously with the formation of the silicon oxide film, which simplifies the manufacturing process.

What is claimed is:

1. A method of manufacturing a semiconductor device, the method comprising:
   (a) forming a thermal oxide film on a surface of a conductive gate electrode comprising silicon;
   (b) removing the thermal oxide film from the gate electrode; and
   (c) forming a suicide film on at least the resulting surface of the gate electrode from which the thermal oxide film has been removed.

2. A method according to claim 1, wherein said forming the thermal oxide film comprising forming the thermal oxide film on the surface of the gate electrode as well as on source and drain regions comprising silicon, and wherein said removing further comprises removing the thermal oxide film from the source and drain regions as well as from the gate electrode.

3. A method according to claim 1, wherein the gate electrode comprising silicon is contaminated and/or damaged by fluorocarbon and/or SiC.

4. A method according to claim 2, wherein the thermal oxide film has a thickness which satisfies $Y1<Y2/X$, wherein Y1 is a thickness of the thermal oxide film, Y2 is a junction depth of the source/drain region and X is a ratio of a consumed thickness of a silicon layer of the source/drain region with respect to the thickness of the thermal oxide film.

5. A method according to claim 1, wherein the thickness of the thermal oxide film is 5 nm or more.

6. A method according to claim 4, wherein the thickness of the suicide film is smaller than a junction depth of the source/drain region.

7. The method of claim 1, further comprising forming an insulative sidewall spacer on at least one sidewall of the gate electrode prior to formation of the thermal oxide film, and
   at a point in time after the thermal oxide film has been removed but before the silicide film has been formed, an upper surface of the gate electrode is at an elevation below an elevation of a top part of the sidewall spacer.

8. A method of manufacturing a semiconductor device, the method comprising:
   forming a gate electrode comprising silicon so as to be supported by a substrate;
   forming a thermal oxide film on a surface of the gate electrode comprising silicon;
   removing at least part of the thermal oxide film from the gate electrode; and
   forming a film comprising a silicide on at least the resulting surface over the gate electrode from which the thermal oxide has been removed.

9. The method of claim 8, further comprising forming an insulative sidewall spacer on at least one sidewall of the gate electrode prior to formation of the thermal oxide film, and
   at a point in time after the thermal oxide film has been removed but before the suicide has been formed, an upper surface of the gate electrode is at an elevation below an elevation of a top part of the sidewall spacer.

* * * * *